United States Patent
Vo et al.

(10) Patent No.: US 11,595,021 B2
(45) Date of Patent: Feb. 28, 2023

(54) SAW RESONATOR COMPRISING LAYERS FOR ATTENUATING PARASITIC WAVES

(71) Applicants: COMMISSARIAT A L'ENERGIE ATOMIQUE ET AUX ENERGIES ALTERNATIVES, Paris (FR); SOITEC, Bernin (FR)

(72) Inventors: Thu Trang Vo, Grenoble (FR); Jean-Sebastien Moulet, Chambery (FR); Alexandre Reinhardt, Saint-Martin-d'Heres (FR); Isabelle Huyet, Crolles (FR); Alexis Drouin, La Buissiere (FR); Yann Sinquin, Grenoble (FR)

(73) Assignees: COMMISSARIAT A L'ENERGIE ATOMIQUE ET AUX ENERGIES ALTERNATIVES, Paris (FR); SOITEC, Bernin (FR)

( * ) Notice: Subject to any disclaimer, the term of this patent is extended or adjusted under 35 U.S.C. 154(b) by 783 days.

(21) Appl. No.: 16/493,560

(22) PCT Filed: Mar. 9, 2018

(86) PCT No.: PCT/FR2018/050559
§ 371 (c)(1),
(2) Date: Sep. 12, 2019

(87) PCT Pub. No.: WO2018/167407
PCT Pub. Date: Sep. 20, 2018

(65) Prior Publication Data
US 2020/0389148 A1 Dec. 10, 2020

(30) Foreign Application Priority Data
Mar. 13, 2017 (FR) ...................... 1752043

(51) Int. Cl.
H03H 9/02 (2006.01)
H03H 3/08 (2006.01)
(Continued)

(52) U.S. Cl.
CPC .......... H03H 9/02866 (2013.01); H03H 3/08 (2013.01); H03H 9/0259 (2013.01);
(Continued)

(58) Field of Classification Search
CPC .. H03H 9/02866; H03H 3/08; H03H 9/02551; H03H 9/02559; H03H 9/0259;
(Continued)

(56) References Cited

U.S. PATENT DOCUMENTS 4,364,017 A 12/1982 Tokunaga et al.
4,500,807 A 2/1985 Yuhara et al.
(Continued)

FOREIGN PATENT DOCUMENTS

EP 0 088 204 A2 9/1983

OTHER PUBLICATIONS

International Search Report dated Jun. 7, 2018 in PCT/FR2018/050559 filed on Mar. 9, 2018.
(Continued)

*Primary Examiner* — Hafizur Rahman
(74) *Attorney, Agent, or Firm* — Oblon, McClelland, Maier & Neustadt, L.L.P.

(57) ABSTRACT

The invention relates to a SAW resonator (100) comprising at least: a substrate (102); a layer (108) of piezoelectric material arranged on the substrate; a first attenuation layer (112) arranged between the substrate and the layer of piezoelectric material, and/or, when the substrate comprises at least two different layers (104, 106), a second attenuation layer (114) arranged between the two layers of the substrate; and in which the at least one attenuation layer is/are heterogeneous.

9 Claims, 2 Drawing Sheets

(51) Int. Cl.
*H03H 9/145* (2006.01)
*H03H 9/25* (2006.01)

(52) U.S. Cl.
CPC .... *H03H 9/02551* (2013.01); *H03H 9/02559* (2013.01); *H03H 9/02598* (2013.01); *H03H 9/02606* (2013.01); *H03H 9/145* (2013.01); *H03H 9/25* (2013.01)

(58) Field of Classification Search
CPC .......... H03H 9/02598; H03H 9/02606; H03H 9/145; H03H 9/25
USPC ..................................................... 310/313 A
See application file for complete search history.

(56) References Cited

U.S. PATENT DOCUMENTS

| | | |
|---|---|---|
| 2006/0202781 A1 | 9/2006 | Pahl |
| 2014/0145558 A1 | 5/2014 | Hori et al. |
| 2017/0033764 A1* | 2/2017 | Inoue ...................... H03H 9/54 |

OTHER PUBLICATIONS

French Preliminary Search Report dated Nov. 14, 2017 in French Application 1752043 filed on Mar. 13, 2017.

* cited by examiner

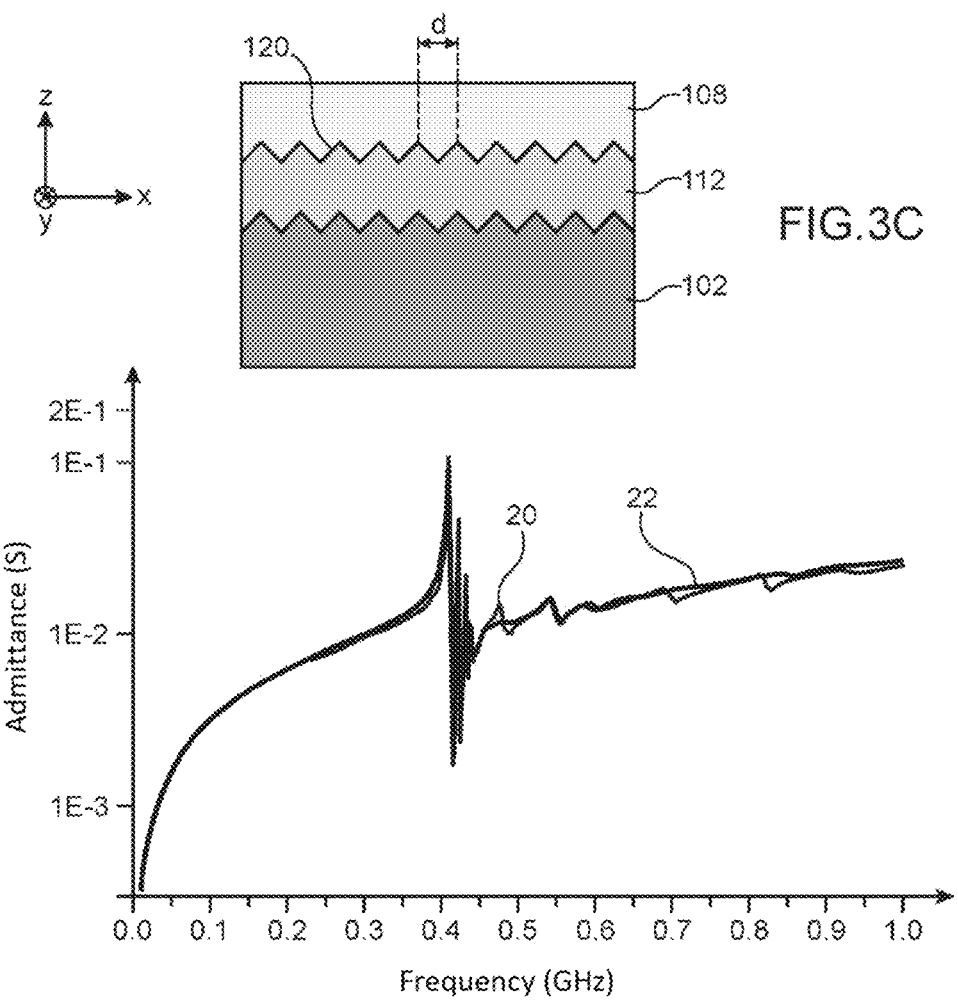
FIG.3C
FIG.4
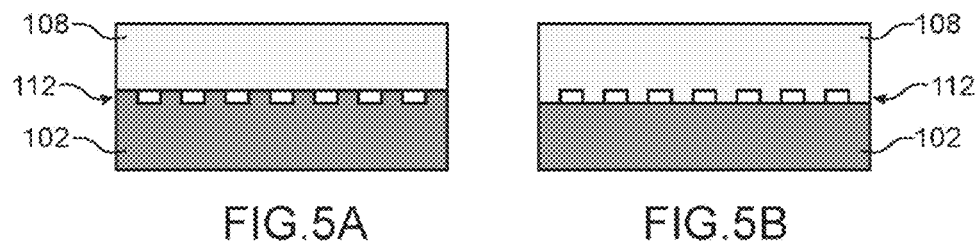
FIG.5A  FIG.5B

SAW RESONATOR COMPRISING LAYERS FOR ATTENUATING PARASITIC WAVES

TECHNICAL FIELD AND PRIOR ART

The invention relates to the field of SAW resonators ("Surface Acoustic Wave"), used in particular to produce SAW filters.

It is known to produce a SAW filter from a solid layer of LTO (Lithium Tantalate). Such a filter is made on a solid substrate of LTO, which is a piezoelectric material, on which a set of electrodes is arranged. This type of filter however has certain disadvantages such as a substantial thermal drift in frequency which is due in particular to the high coefficient of thermal expansion of the LTO (8 times higher than that of silicon).

A solution to this problem is to produce the SAW filter not from a solid substrate of LTO, but by adding a thin layer of LTO on a substrate of silicon, direct or via an intermediate layer of $SiO_2$ interposed between the substrate and the thin piezoelectric layer. This addition mechanically restrains the LTO, therefore limiting its high thermal expansion and thus reducing the thermal drift in frequency of the filter. This alternative offers the possibility of satisfying increasingly drastic requirements due to the multiplication of frequency bands used for the SAW filters. This permits a decrease in the temperature drift of the components produced, making it possible to expand the applications of the SAW filters to devices that currently use the BAW ("Bulk Acoustic Wave") technology which naturally have a lower temperature drift. Compared to the other techniques for reducing the temperature drift, the use of thin layers of piezoelectric materials added onto a substrate for example made of silicon has the advantage of not requiring additional temperature compensation layers, and therefore to not cause any degradation in the quality coefficients or electromagnetic coupling coefficients.

Despite the advantages afforded by such an adding of the layer of piezoelectric material on a substrate of silicon, these filters can still be improved, in particular with those that use the LTO in a crystalline cross-section Y+42° as piezoelectric material. Indeed, this material has the advantage of having a very good compromise between its coefficient of thermal expansion and the electromagnetic coupling that it procures. However, the excited acoustic wave in certain crystalline orientations of the LTO (for example the layer Y+42° which is abundantly used in mobile telephony) is a pseudo-surface wave that results in an imperfect guiding of the waves along the surface of the substrate, with a portion of the acoustic energy being radiated into the depth of the substrate in the form of volume waves. In the case of a thin layer of LTO added onto silicon, these volume waves are reflected at the various interfaces, which causes the excitation of modes guided in the added layer and forms parasites visible on the electrical response of the resonators.

This problem is also found for piezoelectric materials other than LTO, when the crystalline orientation of the piezoelectric material promotes the excitation of a pseudo-surface wave.

FIG. 1 shows the admittance Y, according to the frequency, of a SAW resonator made on a layer of $LiTaO_3$ added on a substrate of silicon with a film of $SiO_2$ used as a bonding layer. In this FIG. 1, the reference 10 designates the resonance peak obtained at the resonance frequency of the resonator, and the reference 12 designates the parasitic frequencies.

It would be desirable to obtain a filter of which the frequency response does not comprise these parasitic resonances.

DISCLOSURE OF THE INVENTION

A purpose of the present invention is to propose a solution for suppressing, or at least limiting or reducing, the parasitic acoustic waves present in the frequency response of the resonator.

For this, the present invention proposes a SAW resonator comprising at least:
- one substrate;
- one layer of piezoelectric material arranged on the substrate;
- one first attenuation layer arranged between the substrate and the layer of piezoelectric material and/or, when the substrate comprises at least two separate layers, one second attenuation layer arranged between the two layers of the substrate, and wherein the attenuation layer or layers are heterogeneous.

In such a resonator, the interface between the layer of piezoelectric material and the substrate and/or, when the substrate comprises at least two layers of different materials, the interface between the layers of the substrate, is replaced by at least one attenuation layer able to attenuate all or a portion of the coupling between the surface waves generated in the piezoelectric material and the guided modes in the substrate, so as to no longer excite these guided modes in the layer of piezoelectric material. An attenuation layer corresponds to a layer that, for example, diffuses or absorbs at least one portion of the parasitic acoustic waves. The parasitic waves are thus suppressed or at least attenuated by the attenuation layer or layers present between the layer of piezoelectric material and the substrate and/or between two layers of the substrate.

In this resonator, when the substrate comprises N stacked layers, with N≥2, it is possible to have N−1 attenuation layers each one arranged between two consecutive layers of the substrate. In addition, it is possible to have several superimposed attenuation layers arranged between two consecutive layers of the substrate.

Advantageously, the heterogeneity of the attention layer or layers may be such that the composition of the attention layer or layers is heterogeneous. A layer of heterogeneous composition designates a layer of material of which the composition is not chemically and/or physically homogeneous, or constant, throughout the whole of its volume. In other words, a layer of heterogeneous composition corresponds to a layer of material that has within chemical and/or physical disparities. This heterogeneity of the composition of the attention layer or layers may be such that the parasitic waves with frequencies higher than the resonance frequency of the resonator are at least attenuated, even suppressed thanks to the presence of the attention layer or layers within the stack of layers of the resonator.

Alternatively, a heterogeneous attenuation layer may correspond to a layer that has at least one portion of at least one of its faces comprising structurings, or roughnesses. In other words, a heterogeneous layer may correspond to a layer of material that has, on at least one portion of at least one of these faces, physical variations of the roughness or structuring type. This heterogeneity of one or several faces of the attention layer or layers may be such that the parasitic waves with frequencies higher than the resonance frequency of the resonator are at least attenuated, even suppressed thanks to the presence of the attention layer or layers within the stack of layers of the resonator.

According to another alternative, the heterogeneous nature of one or more attenuation layers may be due to both a heterogeneous composition within this or these attenuation layers and to one or more heterogeneous faces (i.e. comprising structurings or roughnesses).

Each attenuation layer may correspond to a single layer or to a stack of several layers.

Advantageously, the piezoelectric material may comprise LTO ($LiTaO_3$) and/or LNO ($LiNbO_3$) and/or quartz (crystallised $SiO_2$) and/or Langatate (LGT, $La_3Ga_{5.5}Ta_{0.5}O_{14}$) or Langasite (LGS, $La_3Ga_5SiO_{14}$) or Langanite (LGN, $La_3Ga_{5.5}Nb_{0.5}O_{14}$).

Moreover, the substrate may comprise for example silicon. When the substrate comprises at least two separate layers, one of these layers may comprise silicon and the other $SiO_2$. Alternatively, the substrate may comprise GaN, SiC, sapphire ($Al_2O_3$) or correspond to a substrate of the silicon on insulator type such as for example the SOI type.

The first attenuation layer and/or the second attenuation layer may comprise porosities and/or cavities and/or doped regions and/or at least one face at least partially rough or structured. The composition of the first attenuation layer and/or of the second attenuation layer is heterogeneous when it comprises porosities and/or cavities and/or doped regions. The face or faces at least partially structured may correspond to one or several of the main faces of the attention layer or layers and which are in contact with the layer of piezoelectric material and/or with the substrate.

When the first attenuation layer and/or the second attenuation layer comprises doped regions, said regions may be doped differently from the rest of the first attenuation layer and/or of the second attenuation layer.

One of or each one of the first and second attenuation layers may comprise at least two different material.

When the first attenuation layer and/or the second attenuation layer comprises porosities and/or cavities, the porosities and/or the cavities of the first attenuation layer and/or of the second attenuation layer may each have a substantially spherical or cylindrical shape. However, cavities and/or porosities of an entirely other form are possible and may be produced in the first and/or the second attenuation layers.

The SAW resonator may be such that:
the first attenuation layer is separate from the substrate and from the layer of piezoelectric material, or corresponds to a portion of the substrate and/or of the layer of piezoelectric material, and/or that
the second attenuation layer is separate from the two layers of the substrate, or corresponds to a portion of at least one of the two layers of the substrate.

The first attenuation layer and/or the second attenuation layer may comprise SiOC and/or SiOCH and/or porous silicon and/or a porous organic material and/or polysilicon.

The resonator may further comprise electrodes arranged on the layer of piezoelectric material.

The SAW resonator may be used to synthesise a SAW filter.

Other applications are also possible for the SAW resonator, for example used in a sensor or a circuit that outputs at least one clock signal.

The invention also relates to a method for producing a SAW resonator, comprising at least the implementation of the following steps:
production of a first attenuation layer on a substrate and/or, when the substrate comprises at least two separate layers, of a second attenuation layer between the two layers of the substrate;
production of a layer of piezoelectric material on the substrate or, when the first attenuation layer is present on the substrate, on the first attenuation layer;
and wherein the attenuation layer or layers are heterogeneous.

The production of the first attenuation layer and/or of the second attenuation layer may comprise the implementation of a deposit of at least one porous material and/or the production of cavities by the implementation of steps of photolithography and etching, and/or the doping of regions of the first attenuation layer and/or of the second attenuation layer and/or the implementation of a deposit of material on a rough surface, forming the first attenuation layer and/or the second attenuation layer, and/or the implementation of a treatment that form roughnesses on at least one face of the first attenuation layer and/or of the second attenuation layer.

BRIEF DESCRIPTION OF THE DRAWINGS

The present invention shall be better understood when reading the description of embodiments gives purely as an indication and in no way limiting in reference to the accompanying drawings wherein:

FIGS. 3A to 3C show example embodiments of heterogeneous attenuation layers within a SAW resonator, subject-matter of the present invention;

FIG. 4 shows the attenuation of parasitic waves obtained by using a SAW resonator, subject-matter of the present invention; and FIGS. 5A and 5B of alternative embodiments of attenuation layers of a SAW resonator, subject-matter of the present invention.

Identical, similar or equivalent parts of the various figures described hereinafter bear the same numerical references so as to facilitate passing from one figure to the other.

The various portions shown in the figures are not necessarily shown to a uniform scale, in order to make the figures more legible.

The various possibilities (alternatives and embodiments) must be understood as not being exclusive from one another and can be combined together.

DETAILED DESCRIPTION OF PARTICULAR EMBODIMENTS

Figure 1:
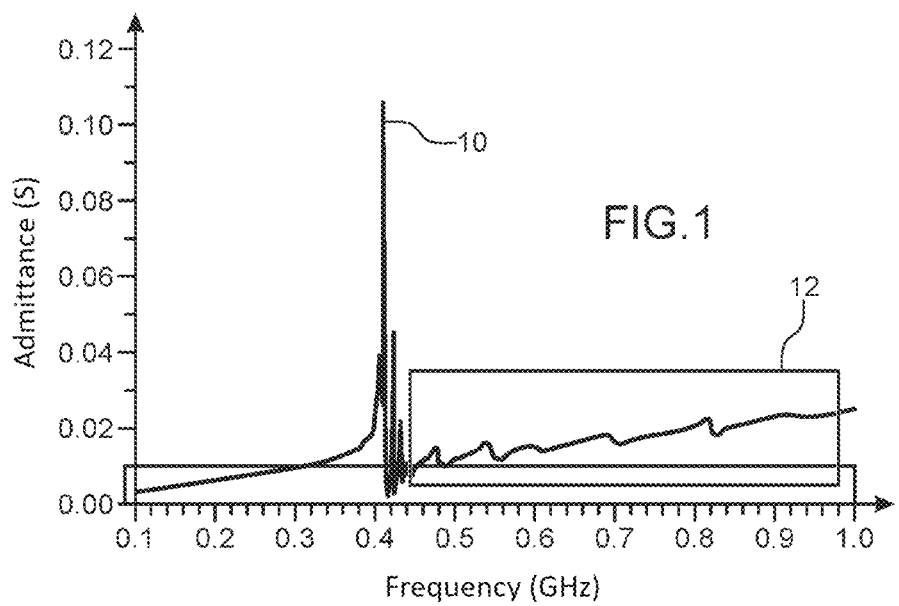
FIG. 1 shows the frequency response of a SAW filter of the prior art.
Figure 2:
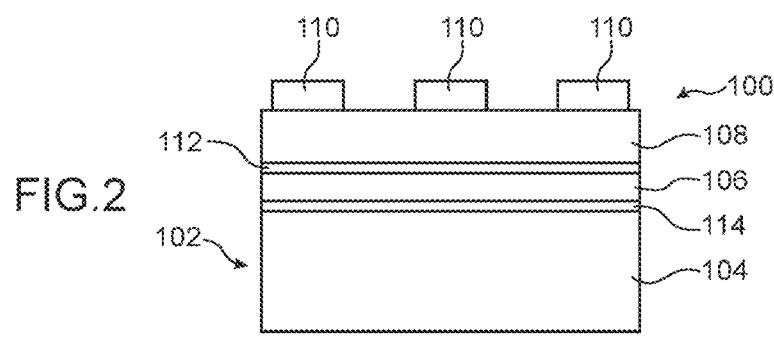
FIG. 2 shows a SAW resonator, subject-matter of the present invention, according to a particular embodiment.

FIG. 2 shows a SAW resonator 100 according to a particular embodiment.

The resonator 100 is produced from a substrate 102. This substrate 102 comprises one or several layers of materials. In the example shown in FIG. 2, the substrate 102 comprises a first layer 104 of solid material, for example silicon, as well as a second layer 106 comprising for example $SiO_2$.

The resonator 100 also comprises a layer of piezoelectric material 108 arranged on the substrate 102, and here on a second layer 106. In this particular embodiment, the piezoelectric material corresponds to LTO. Alternatively, the piezoelectric material may comprise LTO and/or LNO ($LiNbO_3$) and/or quartz (crystallised $SiO_2$) and/or Langatate (LGT, $La_3Ga_{5.5}Ta_{0.5}O_{14}$) and/or Langasite (LGS, $La_3Ga_5SiO_{14}$) and/or Langanite (LGN, $La_3Ga_{5.5}Nb_{0.5}O_{14}$).

The resonator 100 also comprises electrodes 110, corresponding to input and output electrodes of the resonator 100, arranged on the layer of piezoelectric material 108. The electrodes 110 comprise one or several electrically conductive materials, for example metallic materials.

The resonator 100 also comprises a first attenuation layer 112 arranged between the substrate 102 and the layer of piezoelectric material 108, i.e. here between the second layer 106 and the layer of piezoelectric material 108.

The resonator 100 also comprises a second attenuation layer 114 arranged between the two layers 104, 106 of the substrate 102.

In the particular embodiment described here, the solid layer 104 has for example a thickness equal to several hundred microns and corresponds for example to the standard thickness of a substrate of silicon used in microelectronics, the second layer 106 has for example a thickness between about 0 (absence of the second layer 106) and 10 µm, the layer of piezoelectric material 108 has for example a thickness between about 5 µm and 50 µm, the electrodes 110 each have for example a thickness between about a few tens of nanometres and a few hundred nanometres, the first attenuation layer 112 has for example a thickness between about 100 nm and 10 µm, and the second attenuation layer 114 has for example a thickness between about 100 nm and 10 µm.

The attenuation layers 112, 114 each have for example a heterogeneous composition. Thus, each one of the attenuation layers 112, 114 comprises, within, physical and/or chemical disparities.

According to a first embodiment, this heterogeneity of the compositions of the attenuation layers 112, 114 is obtained by forming, within each one of the attenuation layers 112, 114, regions or zones that are doped differently from the rest of these layers 112, 114.

According to a second embodiment, this heterogeneity of the compositions of the attenuation layers 112, 114 is obtained by producing these layers with one or several porous materials, such as SiOC and/or SiOCH and/or porous silicon and/or a porous organic material and/or polysilicon. According to an advantageous embodiment, at least one of the attenuation layers 112, 114 is formed by a layer of polymer, for example resin, which corresponds to highly viscoelastic material, and in which localised and regularly distributed holes in the layer by forming a matrix of cavities 118 are produced.

Figures 3A, 3B:
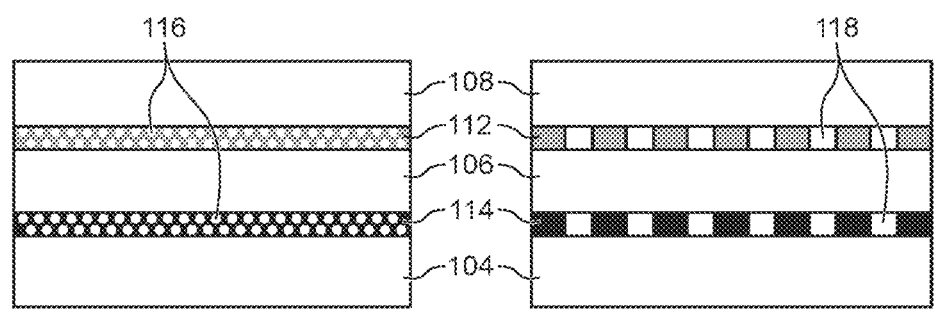

FIG. 3A diagrammatically shows attenuation layers 112, 114 produced with porous materials, with the pores having the reference 116 in this figure.

According to a third embodiment, this heterogeneity of the compositions of the attenuation layers 112, 114 is obtained by producing cavities 118 within these layers. These cavities 118 may be formed through at least one portion of the thickness of the layers 112, 114. FIG. 3B diagrammatically shows attenuation layers 112, 114 comprising such cavities 118. These cavities 118 are for example produced by implementing steps of photolithography and of etching of the layers 112, 114.

According to a fourth embodiment, alternatively or in combination with the heterogeneous composition of the attenuation layers 112, 114, the heterogeneity of one or of several attenuation layers 112, 114 may also be obtained thanks to a rough interface of one or of several of the attenuation layers 112, 114.

FIG. 3C diagrammatically shows the attenuation layer 112 arranged between the substrate 102 and the layer of piezoelectric material 108.

The heterogeneity of the attenuation layer 112 is obtained in this case by the fact that the two main faces of the attenuation layer 112 (that at the interface between the attenuation layer 112 and the piezoelectric layer 108, and that at the interface between the attenuation layer 112 and the substrate 102) each comprise structurings 120, or roughnesses. Alternatively, it is possible that only one of the two main faces of the attenuation layer 112 (advantageously the one that form the interface with the piezoelectric layer 108 since this face is the closest to the parasitic waves to be attenuated) comprises the structurings 120. In FIG. 3C, these structurings 120 are initially produced on the upper face of the substrate 102, then are located on the two faces of the attenuation layer 112 thanks to the deposit of this layer on these structurings.

Furthermore, the attenuation layer 114 located between the two layers 104, 106 of the substrate 102 may also comprise structurings, for example similar to the structurings 120. Finally, for one or each one of the attenuation layers 112, 114, a portion only of one or of each one of these faces may be structured.

The fastening of the attenuation layers 112, 114 with the other layers of the resonator 100 may be obtained by direct bonding, or molecular bonding, or directly by a deposit of these layers on the desired support (for example the layer 104 or the layer 106).

These different embodiments that make it possible to obtain attenuation layers 112, 114 of heterogeneous compositions or that comprise a rough interface are not exclusive with respect to one another. Thus, one or both attenuation layers 112, 114 can have a heterogeneous composition obtained thanks to the presence of regions that are doped differently from the rest of these layers 112, 114 and/or pores 116 and/or cavities 118, with these various heterogeneities able to be combined within the same attenuation layer, with possibly one or several rough interfaces.

Furthermore, the heterogeneity of the first attenuation layer 112 may be of a nature that is similar or not to that of the second attenuation layer 114. For example, it is possible that the heterogeneity of the composition of the first attenuation layer 112 be obtained thanks to the use of at least one porous material in order to form the first attenuation layer 112, and that the heterogeneity of the composition of the second attenuation layer 114 be obtained thanks to the production of cavities within the second attenuation layer 114.

The pores 116 and/or the cavities 118 and/or the doped zones of the first attenuation layer 112 and/or of the second attenuation layer 114 each have for example a substantially spherical or cylindrical shape (with a polygonal or circular section). Furthermore, the pores 116 and/or the cavities 118 are advantageously filled with air or with another material.

Generally, the size and the shape of the pores 116, of the cavities 118 and of the doped zones may vary according to the parasite acoustic wave frequency or frequencies intended to be attenuated and/or absorbed, so as to maximise this attenuation and/or this absorption of parasitic waves by the attenuation layers 112, 114. The dimensions of the pores 116 and/or cavities 118 and/or of the doped zones formed within attenuation layers 112, 114 are for example between about 10 nm and 10 µm, which makes it possible to attenuate parasitic acoustic waves of a frequency of about 1 GHz, or for example between 0.1 and 10 GHz. For example, in order to carry out an absorption of parasitic frequencies of about 500 MHz, cavities 118 of cylindrical shape and of a diameter equal to about 2 µm and of a height between about 5 µm and 10 µm may be produced.

Generally, when an attenuation layer comprises structurings or roughnesses, the patterns of these structurings or roughnesses may be of any shape, and for example random. In addition, the height, or the amplitude, of these structurings or roughnesses (dimension parallel to the axis Z shown in FIG. 3C) is for example of at least 500 nm and for example between about 500 nm and 3 µm, or advantageously between about 1 µm and 2 µm. The pitch between two structurings, i.e. the repetition period of these structurings, is for example at least between about 100 nm and 10 µm. This periodicity is shown in FIG. 3C by the distance d that separates two vertices of two neighbouring structurings.

The curve 20 shown in FIG. 4 corresponds to the admittance Y of a reference SAW resonator that does not comprise any attenuation layer. The curve 22 corresponds to the admittance Y obtained when an attenuation layer 112 having its two rough faces is inserted between the layer of piezoelectric material 108 and the substrate 102. These curves 20 and 22 show that the parasitic waves are attenuated in the presence of such an attenuation layer 112. In the example described here, the range of frequencies in which the attenuation layer 112 is effective is between 0 and 1 GHz.

Furthermore, the effectiveness of the attenuation layers 112, 114 is improved when an acoustic resonance effect of the air or of a fluid (water, nitrogen, etc.) filling the pores 116 and/or the cavities 118 is obtained. For this, the dimensions of the pores 116 and/or cavities 118 may be equal to about half of the acoustic wavelength in the fluid at the frequencies of interest. For example, for a resonance of about 1 GHz, pores 116 filled with air may have a diameter between about 100 nm and 200 nm.

Alternatively, the substrate 102 may comprise a single layer of material that corresponds to the first layer 104. In this case, the resonator 100 comprises a single attenuation layer 112 arranged between the layer of piezoelectric material 108 and the first layer 104.

According to another alternative, the substrate 102 may comprise more than two layers of materials. In this case, the resonator 100 may comprise more than two attenuation layers of heterogeneous composition, with each one of the attenuation layers being arranged either between two layers of the substrate 102, or between the layer of piezoelectric material 108 and the substrate 102 for one of these attenuation layers.

It is also possible that each attenuation layer correspond to a stack of several different layers comprising different materials and/or heterogeneous compositions that are different from one layer to the other.

In the particular embodiment described hereinabove, each one of the attenuation layers 112, 114 corresponds to a separate layer of the substrate 102 and of the layer of piezoelectric material 108. Alternatively, it is possible that at least one of the attenuation layers 112, 114 corresponds to a portion of the substrate 102 and/or of the layer of piezoelectric material 108 that has undergone a local modification in the nature of the substrate 102 and/or of the layer of piezoelectric material 108.

For example, as shown in the diagram of FIG. 5A, the attenuation layer 112 is formed by having structured the upper face (the one intended to be arranged on the side of the layer of piezoelectric material 108) of the substrate 102 via steps of photolithography and of etching. The structured upper portion of the substrate 102 forms the attenuation layer 112 on which the layer of piezoelectric material 108 is then fastened, for example by direct bonding, or molecular bonding. On the diagram of FIG. 5B, the attenuation layer 112 is formed by having structured the lower face (the one intended to be arranged on the side of the substrate 102) of the layer of piezoelectric material 108 via steps of photolithography and of etching. The structured lower portion of the layer of piezoelectric material 108 forms the attenuation layer 112 which is fastened on the substrate 102, for example by direct bonding or molecular bonding.

The invention claimed is:

1. A surface acoustic wave resonator, SAW, comprising at least:
    a substrate;
    a layer of piezoelectric material arranged on the substrate; and
    at least one of a first attenuation layer arranged between the substrate and the layer of piezoelectric material and, when the substrate comprises at least two separate layers, a second attenuation layer arranged between the two layers of the substrate;
    wherein the at least one of the first attenuation layer and the second attenuation layer is able to diffuse or absorb at least one portion of parasitic acoustic waves, and comprises at least one of:
    porous silicon, and
    polysilicon in which are arranged doped regions that render the attenuation layer or layers heterogeneous, the doped regions being selectively doped differently from a remainder of the at least one of the first attenuation layer and the second attenuation layer.

2. The SAW resonator according to claim 1, wherein the piezoelectric material comprises at least one material selected from the group consisting of LTO, LNO, quartz, Langatate, Langasite, and Langanite.

3. The SAW resonator according to claim 1, wherein at least one of the first attenuation layer and the second attenuation layer comprises at least one of the following features: porosities, cavities, at least one face at least partially rough.

4. The SAW resonator according to claim 3, wherein, when the first attenuation layer or the second attenuation layer comprises porosities or cavities, the porosities or the cavities of at least one of the first attenuation layer and the second attenuation layer each have a substantially spherical or cylindrical shape.

5. The SAW resonator according to claim 1, wherein:
    the first attenuation layer is separate from the substrate and from the layer of piezoelectric material, or corresponds to a portion of at least one of the substrate and the layer of piezoelectric material, or
    the second attenuation layer is separate from the two layers of the substrate, or corresponds to a portion of at least one of the two layers of the substrate.

6. The SAW resonator according to claim 1, further comprising electrodes arranged on the layer of piezoelectric material.

7. A method for producing a surface acoustic wave resonator, SAW, comprising:
    producing at least one of a first attenuation layer on a substrate and, when the substrate comprises at least two separate layers, a second attenuation layer between the two layers of the substrate, said at least one of the first attenuation layer and the second attenuation layer comprising at least one of:
    porous silicon, and
    polysilicon in which are arranged doped regions that render the attenuation layer or layers heterogeneous, the doped regions being selectively doped differently from a remainder of the at least one of the first attenuation layer and the second attenuation layer; and producing a layer of piezoelectric material on the substrate or, when the first attenuation layer is present on the substrate, on the first attenuation layer;

wherein said at least one of the first attenuation layer and the second attenuation layer is able to diffuse or absorb at least one portion of parasitic acoustic waves.

8. The method according to claim 7, wherein producing said at least one of the first attenuation layer and the second attenuation layer comprises at least one selected from the group consisting of:

depositing at least one porous material;

producing cavities by implementation of steps of photolithography and etching;

depositing material on a rough surface, forming said at least one of the first attenuation layer and the second attenuation layer; and forming roughnesses on at least one face of said at least one of the first attenuation layer and the second attenuation layer.

9. A surface acoustic wave resonator, SAW, comprising at least:

a substrate;

a layer of piezoelectric material arranged on the substrate; and at least one of a first attenuation layer arranged between the substrate and the layer of piezoelectric material and, when the substrate comprises at least two separate layers, a second attenuation layer arranged between the two layers of the substrate, wherein said at least one of the first attenuation layer and the second attenuation layer is able to diffuse or absorb at least one portion of parasitic acoustic waves, and comprises at least one of porous silicon and polysilicon in which are arranged doped regions that render the attenuation layer or layers heterogeneous, and when the first attenuation layer or the second attenuation layer comprises porosities or cavities, the porosities or the cavities of at least one of the first attenuation layer and the second attenuation layer each have a substantially spherical or cylindrical shape.

* * * * *

UNITED STATES PATENT AND TRADEMARK OFFICE
CERTIFICATE OF CORRECTION

| | |
|---|---|
| PATENT NO. | : 11,595,021 B2 |
| APPLICATION NO. | : 16/493560 |
| DATED | : February 28, 2023 |
| INVENTOR(S) | : Thu Trang Vo et al. |

It is certified that error appears in the above-identified patent and that said Letters Patent is hereby corrected as shown below:

On the Title Page

The 1st Assignee's name is misspelled. Item (73) should read:
--(73) Assignees:
1) COMMISSARIAT A L'ENERGIE ATOMIQUE ET AUX ENERGIES ALTERNATIVES, Paris (FR)
2) SOITEC, Bernin (FR)--

Signed and Sealed this
Eleventh Day of July, 2023

Katherine Kelly Vidal
*Director of the United States Patent and Trademark Office*